United States Patent
Sugiyama et al.

(10) Patent No.: US 9,600,047 B2
(45) Date of Patent: Mar. 21, 2017

(54) ELECTRONIC CONTROL UNIT

(71) Applicant: Hitachi Automotive Systems, Ltd., Hitachinaka-shi, Ibaraki (JP)

(72) Inventors: Yasushi Sugiyama, Hitachinaka (JP); Takuya Mayuzumi, Hitachinaka (JP); Ryosuke Ishida, Hitachinaka (JP); Yasuhiko Okada, Hitachinaka (JP); Kiyoomi Kadoya, Hitachinaka (JP); Kenichi Hoshino, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 202 days.

(21) Appl. No.: 14/379,709

(22) PCT Filed: Feb. 1, 2013

(86) PCT No.: PCT/JP2013/052308
§ 371 (c)(1),
(2) Date: Aug. 19, 2014

(87) PCT Pub. No.: WO2013/145853
PCT Pub. Date: Oct. 3, 2013

(65) Prior Publication Data
US 2015/0039913 A1 Feb. 5, 2015

(30) Foreign Application Priority Data

Mar. 30, 2012 (JP) .................. 2012-080820

(51) Int. Cl.
*G06F 1/28* (2006.01)
*G01R 19/165* (2006.01)
(Continued)

(52) U.S. Cl.
CPC ............... *G06F 1/28* (2013.01); *B60W 10/18* (2013.01); *G01R 19/16538* (2013.01);
(Continued)

(58) Field of Classification Search
None
See application file for complete search history.

(56) References Cited

U.S. PATENT DOCUMENTS 5,438,270 A * 8/1995 Harper .................. H02J 7/0047
320/DIG. 21
6,269,032 B1 7/2001 Takeuchi et al.
(Continued)

FOREIGN PATENT DOCUMENTS

JP 64-7728 A 1/1989
JP 2001-160004 A 6/2001
(Continued)

OTHER PUBLICATIONS

International Search Report (PCT/ISA/210) dated Apr. 16, 2013, with English translation (Five (5) pages).

Primary Examiner — Paul Yanchus, III
(74) Attorney, Agent, or Firm — Crowell & Moring LLP (57) ABSTRACT

Disclosed is an electronic control unit capable of identifying an abnormality in a power supply voltage without narrowing the operating voltage range, and having minimal effects on cost and the circuit mounting surface area. The ECU includes a microcomputer containing an input terminal VCCin and an input terminal Vrin, a power supply IC that supplies a power supply voltage VCC to the input terminal VCCin, and as a reference-voltage-generator circuit a voltage-divider resistor and a voltage-divider resistor configuring a voltage-dividing circuit that outputs a sub-divided voltage Vc is sub-divided from the power supply voltage VCC, a capacitor coupled at one end to the input terminal Vrin and coupled on at the other end to ground, and a voltage isolation element coupled between the voltage-dividing circuit and the input terminal Vrin.

15 Claims, 8 Drawing Sheets (51) Int. Cl.
*B60W 10/18* (2012.01)
*G01R 21/00* (2006.01)
*G06F 1/30* (2006.01)
*G01R 31/40* (2014.01)

(52) U.S. Cl.
CPC .............. G01R 21/006 (2013.01); G06F 1/30 (2013.01); G06F 1/305 (2013.01); *B60W 2600/00* (2013.01); *B60W 2710/18* (2013.01); *G01R 31/40* (2013.01)

(56) References Cited

U.S. PATENT DOCUMENTS

| | | | |
|---|---|---|---|
| 2008/0094034 A1 | 4/2008 | Takahashi et al. | |
| 2010/0017381 A1* | 1/2010 | Watson | G06F 17/30026 707/E17.009 |
| 2010/0231183 A1* | 9/2010 | Jan | H02M 3/156 323/282 |
| 2012/0212871 A1 | 8/2012 | Taniguchi | |

FOREIGN PATENT DOCUMENTS

| | | |
|---|---|---|
| JP | 2007-78465 A | 3/2007 |
| JP | 2008-105478 A | 5/2008 |
| JP | 2010-74870 A | 4/2010 |
| JP | 2011-38997 A | 2/2011 |
| WO | WO 2011/148592 A1 | 12/2011 |

\* cited by examiner

ELECTRONIC CONTROL UNIT

TECHNICAL FIELD

The present invention relates to an electronic control unit mounted in automobiles, etc.

BACKGROUND ART

A power supply device known in the related art includes a voltage stabilizer circuit that generates a reference voltage Vref from an input voltage Vin, and outputs the reference voltage Vref to a control circuit; and a voltage dropping circuit that generates a drive voltage Vcc by causing a voltage drop in the input voltage Vin, and outputting this drive voltage Vcc to a control circuit (See patent literature 1). This power supply device contains a storage unit including plural electrical double layer capacitors coupled in series. Moreover, by obtaining an input voltage Vin from the mutual contact point of the cathode of a diode coupled to the main power supply and a diode coupled to the storage unit, the higher voltage between the main power supply voltage Vb and storage unit voltage Vc that is voltage divided just by a voltage drop along the sequential (forward current) direction of the diodes can serve as an input voltage Vin. A correct input voltage Vin can in this way be continuously supplied to the control circuit by electrical power from the storage unit even if there is a sudden drop in the voltage Vb of the main power supply so that the control circuit can reliably stop operating without causing faulty operation.

CITATION LIST

Patent Literature

Patent literature 1: Japanese Unexamined Patent Application Publication No. 2010-74870

SUMMARY OF INVENTION

Technical Problem

The power supply device disclosed in patent literature 1 requires the mounting of a storage unit which causes a large effect in terms of cost and circuit mounting surface area. The drop in the input voltage Vin is the same as the voltage drop in the sequential direction (forward current) of the diode from the voltage Vb of the main power supply so that the operating voltage range of the control circuit become narrower according to the voltage drop.

In view of the above issues of the related art, the present invention has the object of providing an electronic control unit capable of determining abnormalities in the power supply voltage in the electronic control unit without narrowing the operating voltage range and having little effect in terms of cost and circuit mounting surface area.

Solution to Problem

The electronic control unit of the present invention is comprised of a processor circuit including a first input terminal and a second input terminal, a power supply circuit to supply a power supply voltage to the first input terminal, a voltage-dividing circuit to output a sub-divided voltage from the power supply voltage, a capacitor coupled at one end to the second input terminal and coupled at the other end to ground, and a voltage isolation element coupled between the voltage-dividing circuit and the second input terminal that functions along with the capacitor to output a reference voltage divided from the power supply voltage and a sub-divided voltage to the second input terminal, and in which the processor circuit utilizes the reference voltage input to the second input terminal to detect an abnormality in the power supply voltage.

Advantageous Effects of Invention

The present invention is capable of rendering an electronic circuit unit capable of determining abnormalities in the power supply voltage in the electronic control unit without narrowing the operating voltage range and having little effect in terms of cost and circuit mounting surface area.

DESCRIPTION OF EMBODIMENTS

First Embodiment

Figure 1:
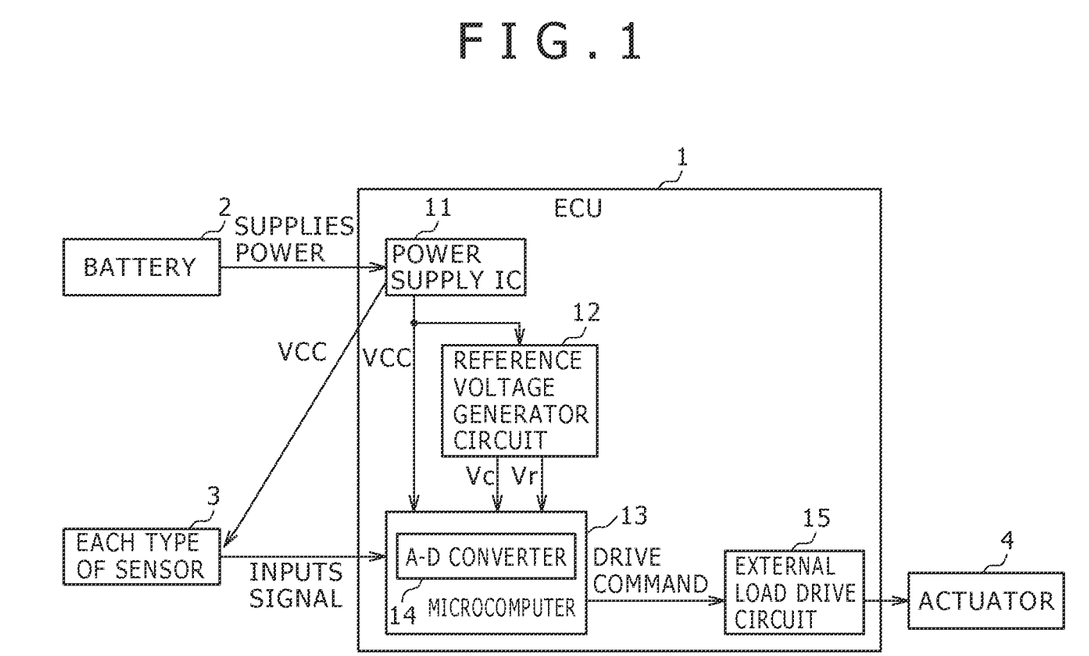
FIG. 1 is a drawing showing the overall structure of the electronic control unit of the present invention.

The first embodiment of the present invention is described next. FIG. 1 is a drawing showing the overall structure of the electronic control unit (ECU) of the present invention. As shown in FIG. 1, an ECU 1 includes a power supply IC 11, a reference voltage generator circuit 12, a microcomputer 13, and an external load drive circuit 15. This ECU 1 is utilized while mounted in an automobile.

A power supply IC 11 in the ECU 1, receives power supplied from the battery mounted in the vehicle and generates a power supply voltage VCC based on this power. Along with being supplied to the microcomputer 13 from the power supply IC 11, the power supply voltage VCC is also supplied to the each type of sensor 3 mounted outside of the ECU 1.

Each type of sensor 3 is a sensor type for detecting the vehicle drive status and for example includes sensors for detecting the engine rotation (rpm) speed or sensors for detecting the vehicle speed. Signals showing detection results from each type of sensor 3 are output to the ECU 1 from each type of sensor 3 and utilized for vehicle control by the ECU 1.

The reference voltage generator circuit 12 is input by a supply voltage VCC supplied to the microcomputer 13 from the power supply IC 11. In the microcomputer 13, based on this power supply voltage VCC, a sub-divided voltage Vc and a reference voltage Vr utilized for detecting an abnormality in the supply voltage VCC are output to the microcomputer 13. The reference voltage generator circuit 12 is described in detail later on.

The microcomputer 13 contains an internal A-D (analog-digital) converter 14. The microcomputer 13 utilizes this A-D converter 14 to convert the input signals from each type of sensor 3 to digital values and load those digital values. The microcomputer 13 then utilizes the loaded digital values to perform the specified processing and outputs drive command to the external load drive circuit 15 based on results from that processing.

The external load drive circuit 15 controls the driving of the actuator 4 according to drive commands from the microcomputer 13. The actuator 4 is mounted in order to execute each operation in the vehicle and for example regulates the fuel injection quantity.

In addition to the input signals from each type of sensor 3, the microcomputer 13 also converts the sub-voltage Vc and reference voltage Vr from the reference voltage generator circuit 12 into digital values by utilizing the A-D converter 14 and loads the digital values. Then, by comparing these respective digital values, the microcomputer 13 can detect an abnormality if there is an abnormality in the power supply voltage VCC. When the microcomputer 13 detects an abnormality in the power supply voltage VCC the microcomputer 13 controls the actuator 4 so as to perform a preset operation for abnormalities and to safely stop the vehicle.

Figure 2:
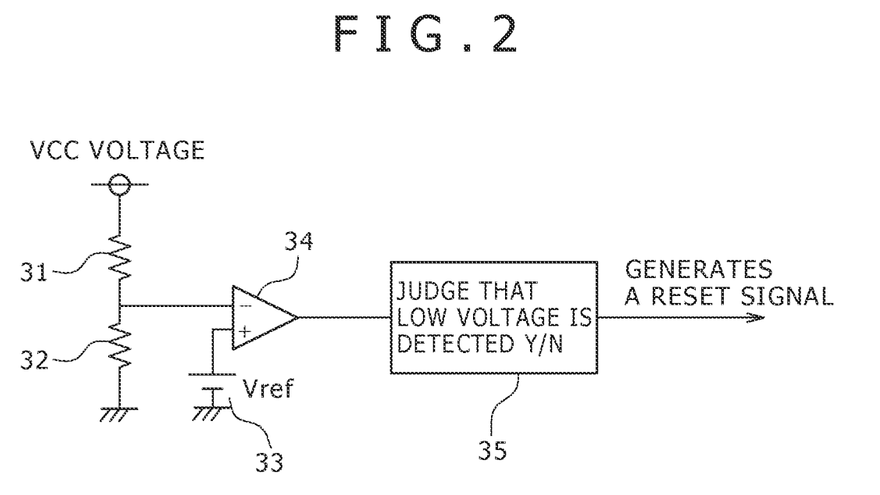
FIG. 2 is a drawing showing the structure of the abnormal voltage detection circuit of a comparative example.

The reference voltage generator circuit 12 is described in detail next. FIG. 2 is a diagram for showing the structure of the abnormal voltage detection circuit of the related art as a comparative example for comparing with the reference voltage generator circuit 12 of the present invention.

In the abnormal voltage detection circuit of the comparative example, a comparator circuit 34 compares the reference voltage Vref generated by the reference voltage source 33 with the sub-voltage obtained from dividing the VCC voltage by a resistor 31 and a resistor 32. The reference voltage source 33 generates a reference voltage Vref based on the bandgap energy of the silicon. Comparison results from the comparator circuit 34 are input to the low-voltage detection judgment circuit 35. The low-voltage detection judgment circuit 35 decides whether the VCC voltage is abnormal or not based on the comparison results from the comparator circuit 34 and if the comparison results are decided as abnormal, generates a reset signal for stopping the microcomputer.

When utilizing the abnormal voltage detection circuit as described above and the VCC voltage drops below a specified value, the abnormal voltage detection circuit is capable of detecting this state as an abnormal drop in the VCC voltage. However, when the VCC voltage rises to larger than a specified value, the abnormal voltage detection circuit cannot detect this state as an abnormal rise in the VCC voltage. By combining plural abnormal voltage detection circuits such as in FIG. 2, detecting an abnormal drop and detecting an abnormal rise in the VCC voltage is possible however in that case the circuit structure becomes complicated and the problem of a cost increase for the electronic control circuit occurs.

The above described abnormal voltage detection circuit generates a reference voltage Vref that is unrelated to the VCC voltage by using the bandgap energy of the silicon and compares the VCC voltage with the reference voltage Vref to decide if the VCC voltage is abnormal or not. Therefore the problem occurs that variations in the VCC voltage that occur due to the difference between individual power supply circuits cannot be reflected in the threshold value of the abnormal voltage.

Figure 3:
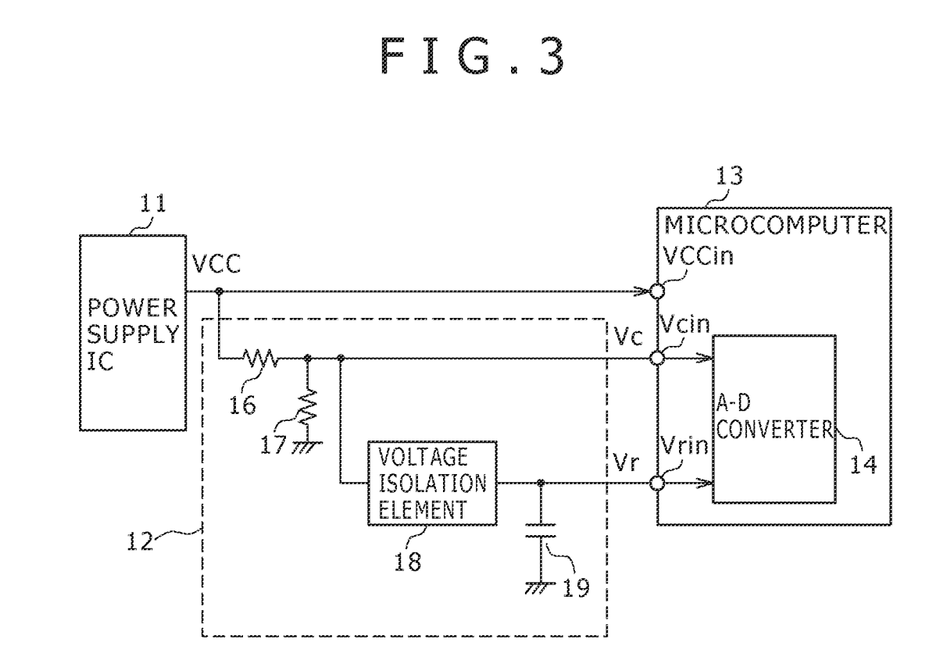
FIG. 3 is a drawing showing the structure of the reference voltage generator circuit of a first embodiment of the present invention.

Whereupon in order to resolve the problem points in the above described comparative example, the present embodiment has a structure of the reference voltage generator circuit 12 as shown in FIG. 3. The operation of the reference voltage generator circuit 12 is described next while referring to FIG. 3.

The reference voltage generator circuit 12 of FIG. 3 contains a circuit structure such as shown by the broken lines and that includes a voltage-divider resistor 16, a voltage-divider resistor 17, a voltage isolation element 18, and a capacitor 19.

The voltage-divider resistor 16 and the voltage-divider resistor 17 configure a voltage-dividing circuit that divides the power supply voltage VCC output from the power supply IC 11 to generate a sub-divided voltage Vc between the voltage-divider resistor 16 and a voltage-divider resistor 17. The sub-divided voltage Vc is output to the input terminal Vcin of microcomputer 13 and also output to the voltage isolation element 18. The value of the sub-divided voltage Vc is determined by the values of the power supply voltage VCC and the voltage division ratio set according to each resistance value of the voltage-divider resistor 16 and a voltage-divider resistor 17.

One end of the capacitor 19 is coupled to the input terminal Vrin of the microcomputer 13 and the other end is coupled to ground. The voltage isolation element 18 is an element that functions along with the capacitor 19 to generate a reference voltage Vr that is isolated from the power supply voltage VCC and the sub-divided voltage Vc and that is coupled between the voltage-dividing circuit and input terminal Vrin of the microcomputer 13. The reference voltage Vr generated by the voltage isolation element 18 and the capacitor 19 is output to the input terminal Vrin of the microcomputer 13. A specific example and the operation of the voltage isolation element 18 are described next in detail.

The power supply IC 11 supplies a power supply voltage VCC to the input terminal VCCin of microcomputer 13. The microcomputer 13 is supplied with this power supply voltage VCC and by utilizes the A-D converter 14 to convert the reference voltage Vr input to the input terminal Vrin, and the sub-divided voltage Vc input to the input terminal Vcin into respective digital values and load these digital values. These digital values are compared with each other and an abnormality in the power supply voltage VCC is detected based on the comparison results.

As described above, the present embodiment detects an abnormality in the power supply voltage VCC by comparing the reference voltage Vr and sub-divided voltage Vc converted to digital values by the A-D converter 14 in the microcomputer 13. The present embodiment is therefore capable of detecting an abnormal rise in the VCC voltage which was impossible for the comparative example as described in FIG. 2.

The present embodiment is further capable of generating a reference voltage Vr based on the sub-divided voltage Vc obtained by sub-dividing the power supply voltage VCC and utilizing this reference voltage Vr to detect an abnormality in the power supply voltage VCC. The present embodiment is therefore capable of accurately detecting an abnormality in the power supply voltage VCC by reflecting the variations in power supply voltage VCC caused by individual difference in the power supplies IC 11.

Figure 4:
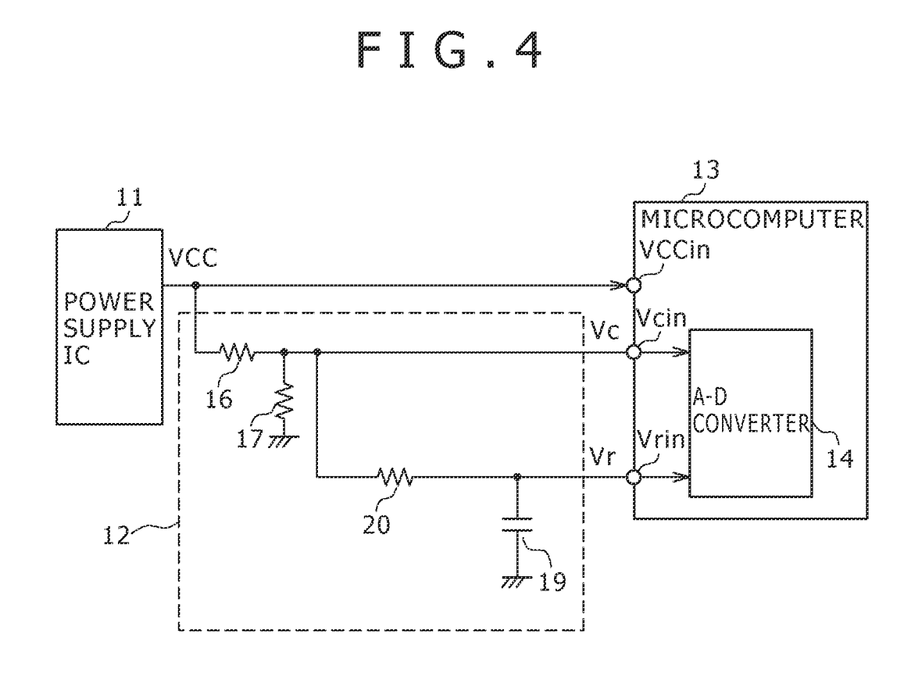
FIG. 4 is a drawing showing the structure of the reference voltage generator circuit when utilizing a resistor in the voltage isolation element of the first embodiment.

A specific example and operation of the voltage isolation element 18 in FIG. 3 is described next in detail. The example in the present embodiment utilizes a resistor in the voltage isolation element 18. FIG. 4 is a drawing showing the structure of the reference voltage generator circuit 12 when utilizing a resistor 20 in the voltage isolation element 18. In FIG. 4, an integrating circuit is configured from the resistor 20 and the capacitor 19. The output from this integrating circuit is output as a reference voltage Vr to the input terminal Vrin of the microcomputer 13.

When the power supply voltage VCC from the power supply IC 11 is a specific normal value, the sub-divided voltage Vc and the reference voltage Vr are output at the same size. When an abnormality occurs in the power supply voltage VCC and a fluctuation in that size occurs, the sub-divided voltage Vc also immediately fluctuates according to that supply voltage Vcc fluctuation. The fluctuation in the reference voltage Vr output from the integrating circuit on other hand is delayed according to a time constant determined according to the capacitance of the capacitor 19 and the resistance of the resistor 20, and the voltage after fluctuation of the power supply voltage VCC is maintained for a fixed period at the voltage value before fluctuation. Namely, the delay effect rendered by this type of integrating circuit is capable of outputting the reference voltage Vr as a voltage isolated from the power supply voltage VCC and the sub-divided voltage Vc. Therefore, by comparing the reference voltage Vr and the sub-divided voltage Vc converted to digital values in the A-D converter 14 in the microcomputer 13, and deciding that the power supply voltage VCC is abnormal when the difference between the reference voltage Vr and the sub-divided voltage Vc are greater than a specified value, an abnormality in the power supply voltage VCC can be detected.

The time constant of the integrating circuit in the circuit structure of FIG. 4 is preferably set according to the time until the microcomputer 13 starts operating after the power supply IC 11 starts supplying the supply voltage VCC, or the time until the microcomputer 13 detects the abnormality after an abnormality occurs in the power supply voltage VCC. For example, the charging of the capacitor 19 can be completed before the start of microcomputer 13 operation by setting a time constant that is shorter than the start time of the microcomputer 13 so that the time constant is shorter than the time the power supply IC 11 starts supplying the power supply voltage VCC to the start of microcomputer 13 operation.

For example when an abnormality in the power supply voltage VCC is detected by the microcomputer 13 comparing the sub-divided voltage Vc and reference voltage Vc at 1 ms periods, and the difference between them is 50 mV or more, the capacitance of the capacitor 19 can be set to 1 µF and the resistance of the resistor 20 can be set to 50 kΩ.

The above described first embodiment of the present invention renders the following effects.

(1) An ECU 1 includes a microcomputer 13 containing an input terminal VCCin and an input terminal Vrin, a power supply IC 11 that supplies a power supply voltage VCC to the input terminal VCCin, and as a reference voltage generator circuit 12 a voltage-divider resistor 16 and a voltage-divider resistor 17 configuring a voltage-dividing circuit that outputs a sub-divided voltage Vc sub-divided from the power supply voltage VCC, a capacitor 19 coupled at one end to the input terminal Vrin and coupled at the other end to the ground, and a voltage isolation element 18 coupled between the voltage-dividing circuit and the input terminal Vrin, and that functions along with the capacitor 19 to output a reference voltage Vr isolated from the power supply voltage VCC and the sub-divided voltage Vc, to the input terminal Vrin. The microcomputer 13 in the ECU 1 utilizes the reference voltage Vr input to the input terminal Vrin to detect an abnormality in the power supply voltage VCC. An abnormality in the power supply voltage VCC can in this way be determined in the ECU 1 without narrowing the operating voltage range and with little effect in terms of cost and circuit mounting surface area.

(2) The microcomputer 13 further contains an input terminal Vcin for inputting a sub-divided voltage Vc from a voltage-dividing circuit, and compares a reference voltage Vr input to the input terminal Vrin and a sub-divided voltage Vc input to the input terminal Vcin, and detects an abnormality in the power supply voltage VCC based on the comparison results. An abnormality in the power supply voltage VCC can be easily and reliably detected in this way.

(3) The voltage isolation element 18 includes a resistor 20. The resistor 20 and capacitor 19 together configure an integrating circuit, and rendered so as to output the output from the integrating circuit as the reference voltage Vr, to the input terminal Vrin. The reference voltage Vr before the power supply voltage VCC fluctuation is in this way maintained for a specified time even after the power supply voltage VCC fluctuation, and the reference voltage Vr can be output as a voltage isolated from the power supply voltage VCC and the sub-divided voltage Vc.

(4) The time constant for the above described integrating circuit can be set according to at least either a time until the microcomputer 13 starts operating after the power supply IC 11 starts supplying the power supply voltage VCC, or a time until the microcomputer 13 detects the abnormality after an abnormality occurs in the power supply voltage VCC. By making this setting the charging of the capacitor 19 can be completed before the start of operation of microcomputer 13, and an abnormality in the power supply voltage VCC can be detected with greater reliability.

Second Embodiment

Figure 5:
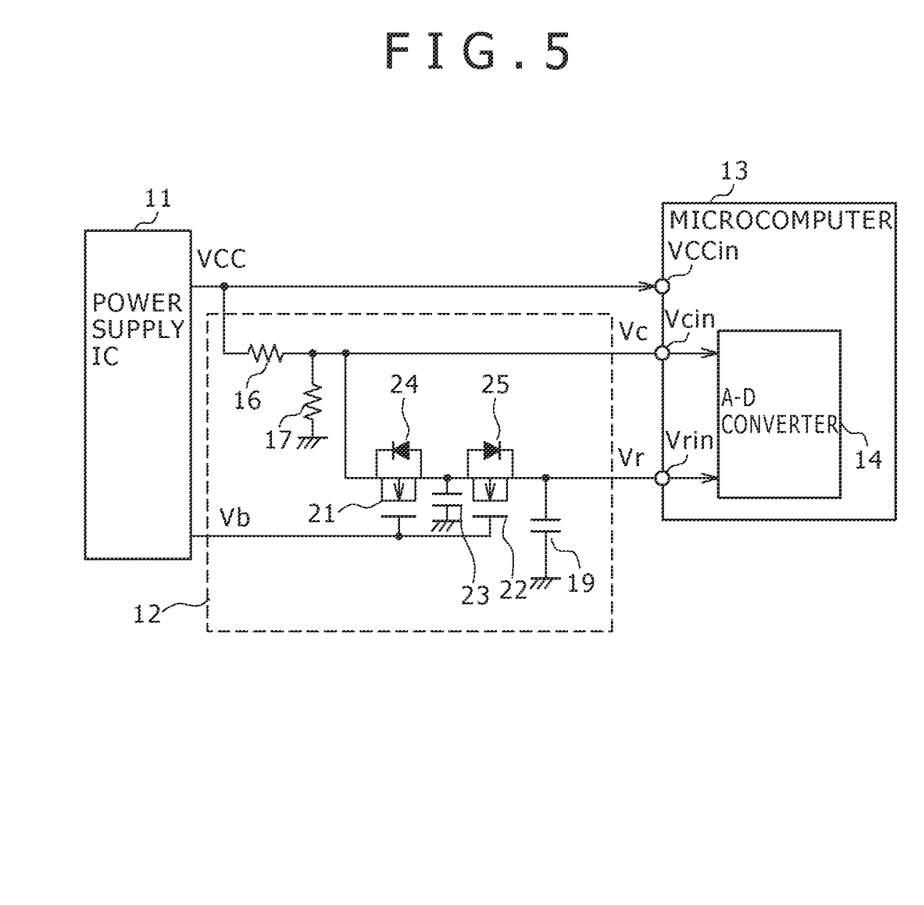
FIG. 5 is a drawing showing the structure of the reference voltage generator circuit when utilizing a switching circuit in the voltage isolation element of a second embodiment.

The second embodiment of the present invention is described next. The present embodiment is described utilizing an example in which a switching circuit is added for switching the coupling state between the input terminal Vrin of microcomputer 13 and the voltage-dividing circuit configured from the voltage-divider resistor 16 and voltage-divider resistor 17, in the voltage isolation element 18 of FIG. 3. FIG. 5 is a drawing showing the structure of the reference voltage generator circuit 12 when utilizing a switching circuit configured from a MOSFET 21, 22, a capacitor 23, and the diodes 24, 25 in the voltage isolation element 18.

In FIG. 5, the n-type MOSFET 21 and 22 respectively function as switching devices by switching the conducting state between the drain and the source according to the gate voltage Vb from the power supply IC 11. The sources of the MOSFETs 21 and 22 are mutually coupled to each other. Also the drain of the MOSFET 21 is coupled to the voltage-dividing circuit side, and the drain of the MOSFET 22 is coupled to the input terminal Vrin side of the microcomputer 13. The MOSFETs 21, 22 preferably have as little leak current as possible.

The capacitor 23 is coupled at one end to the MOSFETs 21 and 22 and coupled on the other end to ground.

The diodes 24 and 25 are installed for protecting the respective MOSFETs 21 and 22 from inverse voltage. The diode 24 is coupled between both switch ends of the MOSFET 21 or in other words in the direction from the source side to drain side between the drain and source; or namely coupled in a sequential direction from the capacitor 23 towards the voltage-dividing circuit. The diode 25 is in the same way, coupled between both switch ends of the MOSFET 22 or in other words in a direction from the source side to the drain side between the drain and source; or namely coupled in a sequential direction from the capacitor 23 towards the input terminal Vrin of microcomputer 13. The MOSFETs 21 and 22 may also have a structure that internally includes the diodes 24, 25.

When the power supply voltage VCC from the power supply IC 11 is a specified normal value, the sub-divided voltage Vc and reference voltage Vr are output at the same size. The power supply IC 11 at this time output a gate voltage Vb as a control signal for controlling the switching operation of the MOSFET 21, 22 by periodically switching the gate voltage Vb from low to high. When this switching occurs, the MOSFET 21, 22 are respectively switched from an open state to a conducting state in the period that the gate voltage Vb is high, and the capacitors 19, 23 are respectively charged according to the reference voltage Vr.

Here, when an abnormality occurs in the power supply voltage VCC and a fluctuation at that size occurs, the power supply IC 11 stops the above described control signal and maintains the gate voltage Vc at low level. The MOSFET 21, 22 then respectively reach an open state and the voltage-dividing circuit configured from the voltage-divider resistor 16 and a voltage-divider resistor 17, and the input terminal Vrin of the microcomputer 13 are cut off from each other. The reference voltage Vr is as a result maintained at the voltage prior to fluctuation. The reference voltage Vr can in this way be output as a voltage isolated from the power supply voltage VCC and the sub-divided voltage Vc. The microcomputer 13 can therefore compare the reference voltage Vr and the sub-divided voltage Vc converted into digital values by the A-D converter 14, and by judging that the power supply voltage VCC is abnormal when the difference between the reference voltage Vr and the sub-divided voltage Vc is a specified value or more, can detect an abnormality in the power supply voltage VCC.

When the power supply voltage VCC rises higher than in normal operation and the MOSFET 21, 22 are in an open state, the voltage of the capacitors 19 and 23 become lower than the sub-divided voltage Vc. In that case, the current from the voltage-dividing circuit side to the capacitor 23 side is cut off by the diode 24 so that the reference voltage Vr is maintained. However, when the power supply voltage VCC falls more than that in normal operation and the MOSFET 21, 22 reach an open state, the voltage of the capacitors 19 and 23 after the open state become higher than the sub-divided voltage Vc. In that case, the current from the capacitor 19 side to the capacitor 23 side is cutoff by the diode 25 so that the reference voltage Vr is maintained.

The period in which the power supply IC 11 periodically switches the gate voltage Vb from low to high is preferably set to a value so that the reference voltage Vr can be maintained at a specified level when the power supply voltage VCC is a fixed normal value, and the power supply voltage VCC is not likely to be judged as abnormal by the microcomputer 13. The value can be set by taking into account the leak current of the MOSFET 21, 22 or the leak current from the capacitor 19 to the input terminal Vrin of microcomputer 13.

For example, at a leak current of the MOSFETs 21, 22 and a leak current to the input terminal Vrin from the capacitor 19 are respectively 1 μA, and 0.2 μA; when the power supply voltage VCC is detected as abnormal by the microcomputer 13 when the difference between the reference voltage Vr and the sub-divided voltage Vc is 50 mV or more, the period that the power supply IC 11 switches the gate voltage Vb can be set to 40 ms.

Besides the effects (1) and (2) described in the first embodiment, the above described second embodiment of the present invention renders the following effects.

(5) The voltage isolation element 18 includes a switching circuit for switching the coupling state between the voltage-dividing circuit configured from the voltage-divider resistor 16 and voltage-divider resistor 17, and the input terminal Vrin of microcomputer 13. This switching circuit contains a MOSFET 21 coupled to the voltage-dividing circuit side; a MOSFET 22 coupled to the input terminal Vrin side; a capacitor 23 coupled on one end between the MOSFET 21 and MOSFET 22, and coupled to ground on the other end; a diode 24 coupled between both switch ends of the MOSFET 21, and in the sequential direction from the capacitor 23 towards the voltage-dividing circuit; and a diode 25 coupled between both switch ends of the MOSFET 22, and in the sequential direction from the capacitor 23 towards the input terminal Vrin. When an abnormality occurs in the power supply voltage VCC, the coupling between the voltage-dividing circuit and the input terminal Vrin is cut to set the MOSFET 21, 22 to an open state. The reference voltage Vr before fluctuation can in this way be maintained for an even longer period than the first embodiment even after the power supply voltage VCC fluctuates, and the reference voltage Vr can be output as a voltage isolated from the power supply voltage VCC and sub-divided voltage Vc.

(6) The power supply IC 11 periodically outputs a gate voltage Vb as a control signal for switching the states of the MOSFET 21 and 22 from the open state to the conducting state to the MOSFET 21 and 22, and also stops the control signal and cuts the coupling between the voltage-dividing circuit and input terminal Vrin when an abnormality occurs in the power supply voltage VCC. The capacitors 19, 23 are respectively charged according to the reference voltage Vr when the power supply voltage VCC is normal, and can maintain the reference voltage Vr at a voltage prior to the fluctuation by setting the states of the MOSFET 21 and 22 to the open state when an abnormality occurs in the power supply voltage VCC.

In the above described second embodiment, an example of a switching circuit utilizing a MOSFET 21 and 22 as switching devices is described however other switching devices may also be utilized. In that case, the capacitor 23 and the diodes 24, 25 may be deleted if unnecessary. Any switching circuit configuration may be utilized as the voltage isolation element 18 if the coupling state between the voltage-dividing circuit configured from the voltage-divider resistor 16 and voltage-divider resistor 17, and the input terminal Vrin of microcomputer 13 can be selected, and if the coupling state can be cut when an abnormality occurs in the power supply voltage VCC. Moreover, the gate voltage Vb may be output from other than the power supply IC 11.

Third Embodiment

Figure 6:
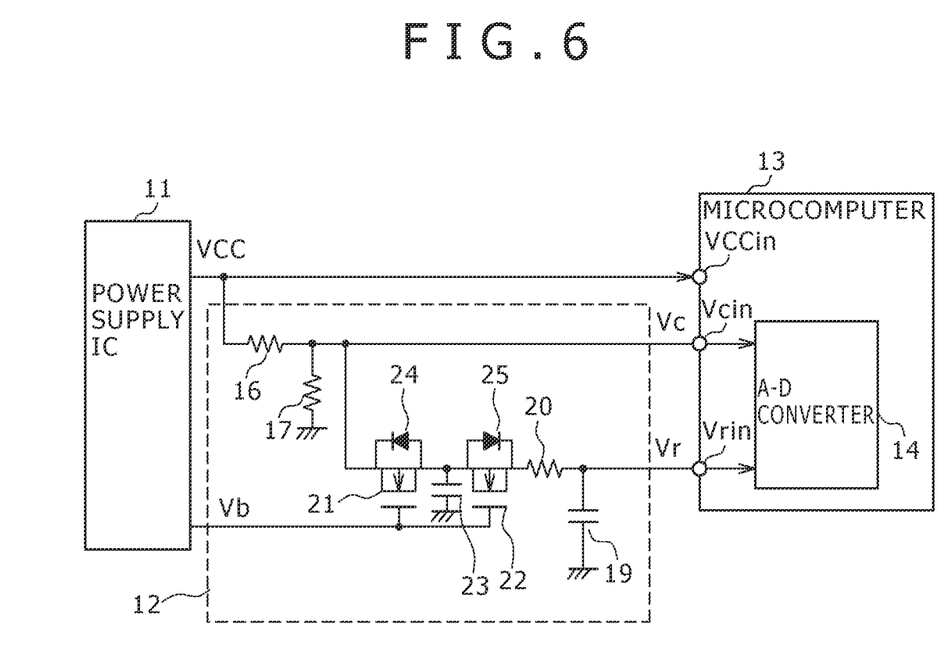
FIG. 6 is a drawing showing the structure of the reference voltage generator circuit when utilizing a resistor and switching circuit in the voltage isolation element of a third embodiment.

The third embodiment of the present invention is described next. In this embodiment, an example in which the resistor 20 shown in FIG. 4 and the switching circuit shown in FIG. 5 is utilized in the voltage isolation element 18 of FIG. 3. FIG. 6 is a drawing showing the structure of the reference voltage generator circuit 12 when these components are utilized in the voltage isolation element 18.

The switching circuit in FIG. 6, configured from the resistor 20, MOSFET 21, 22, capacitor 23, and diodes 24, 25 performs the same operation as respectively described in the first embodiment and the second embodiment. This type of circuit structure allows maintaining the reference voltage Vr for a specified period at the voltage before the fluctuation by applying an integrating circuit configured from the resistor 20 and the capacitor 19, even when an abnormality occurs in the power supply voltage VCC while the gate voltage Vb is in the high level period, and the gate voltage Vb is maintained unchanged at high level.

The above described third embodiment of the present invention is capable of rendering the same effect as the respectively described first and second embodiments.

Fourth Embodiment

Figure 7:
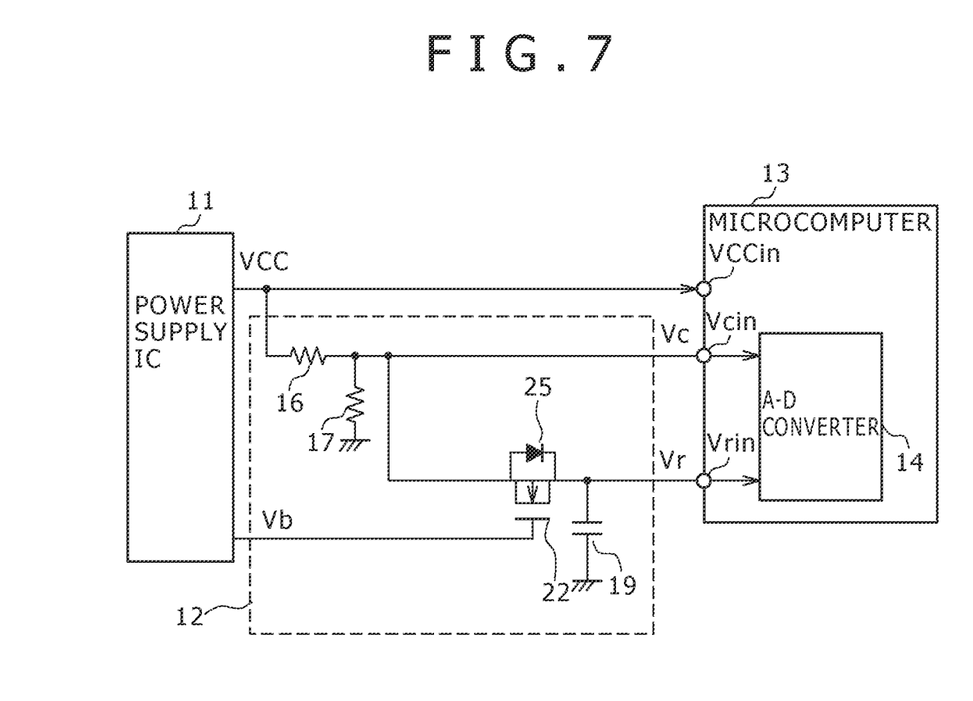
FIG. 7 is a drawing showing the structure of the reference voltage generator circuit when utilizing another switching circuit in the voltage isolation element of a fourth embodiment.

The fourth embodiment of the present invention is described next. The example for the present embodiment describes a switching circuit in which the MOSFET 21, capacitor 23, and diode 24 are omitted from the switching circuit of FIG. 5 described in the second embodiment, and that utilizes only a MOSFET 22 and a diode 25. FIG. 7 is a drawing showing the structure of the reference voltage generator circuit 12 when utilizing a switching circuit different from that in FIG. 5 in a voltage isolation element 18.

In FIG. 6, the switching circuit configured from the MOSFET 22 and the diode 25 performs the same operation as described in the second embodiment. Also, the voltage IC 11 periodically switches the gate voltage Vb from low to high for output as a control signal to control the switching operation of the MOSFET 22 the same as described in the second embodiment, and when an abnormality occurs in the power supply voltage VCC and there is a fluctuation in that size, the control signal is stopped and maintained a low level. When an abnormality occurs where the power supply voltage VCC drops more than during normal operation, this type of circuit structure cuts the coupling between the voltage-dividing circuit configured from the voltage-divider resistor 16 and a voltage-divider resistor 17 and the input terminal Vrin of microcomputer 13, and maintains the reference voltage Vr at the voltage prior to fluctuation.

In the above described fourth embodiment of the present invention, an example is described having a switching circuit structure utilizing only a MOSFET 22 and a diode 25 and in which the MOSFET 21, capacitor 23, and diode 24 are omitted from the switching circuit of FIG. 5. Conversely however, a switching circuit structure may be utilized in which the MOSFET 22, capacitor 23, and diode 25 are omitted from the switching circuit of FIG. 5, and only the MOSFET 21 and the diode 24 are utilized. When this type of circuit structure is utilized and an abnormality occurs where the power supply voltage VCC is reduced more than during normal operation, the coupling between the voltage-dividing circuit configured from the voltage-divider resistor 16 and a voltage-divider resistor 17 and the input terminal Vrin of microcomputer 13 is cut, and the reference voltage Vr can be maintained at the voltage prior to fluctuation.

Also in the above described fourth embodiment of the present invention, an example is described for a switching circuit structure configured from only the MOSFET 22 and the diode 25, and where the MOSFET 21, capacitor 23, and diode 24 are omitted from the switching circuit of FIG. 5. However, the same structure may be utilized in the switching circuit of FIG. 6. Namely, a switching circuit that is configured from a resistor 20, a MOSFET 22, and a diode 25 may be utilized as the voltage isolation element 18. The structure of the switching circuit may also be substituted such as with an above described variation. Namely, a switching circuit configured from a resistor 20, a MOSFET 21, and a diode 24 may be utilized as the voltage isolation element 18.

Fifth Embodiment

Figure 8:
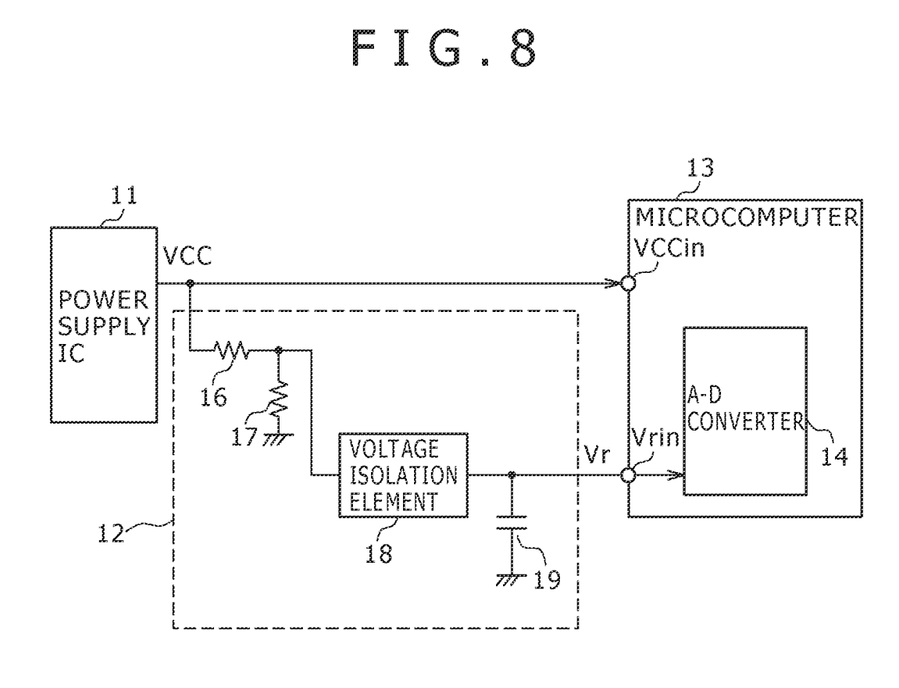
FIG. 8 is a drawing showing the structure of the reference voltage generator circuit of a fifth embodiment of the present invention.

The fifth embodiment of the present embodiment is described next. In the present embodiment, an example is described in which the input terminal Vcin in FIG. 3 for inputting the sub-divided voltage Vc from the microcomputer 13 is omitted. FIG. 8 is a drawing showing the structure of the reference voltage generator circuit 12 of the present embodiment. In the present embodiment, any of the structures described for the first through the fourth embodiments may be utilized as the voltage isolation element 18.

In the present embodiment as shown in FIG. 8, there is no input terminal Vcin mounted in the microcomputer 13, and there is no sub-divided voltage Vc output from the voltage-dividing circuit configured from the voltage-divider resistor 16 and a voltage-divider resistor 17, to the microcomputer 13. The microcomputer 13 therefore respectively converts the reference voltage Vr input to the input terminal Vrin, and the power supply voltage VCC input to the input terminal VCCin to digital values in the A-D converter 14 and loads these digital values without utilizing the sub-divided voltage Vc. A comparison of these digital values is made and an abnormality in the power supply voltage VCC is detected based on the comparison results.

In the present embodiment, the microcomputer 13 performs conversion to the respective digital values in the A-D converter 14 based on the power supply voltage VCC and loads these digital values. There is therefore no abnormality in the reference voltage Vr when an abnormality occurs in the power supply voltage VCC but there is a fluctuation in the value loaded by the microcomputer 13. Consequently, the power supply voltage VCC can therefore be judged as abnormal when the difference between these values has become larger than a specified value so that an abnormality in the power supply voltage VCC can be detected.

The above described fifth embodiment of the present invention renders the following effects in addition to each of the effects (1), (3), and (4) described in the first embodiment and each of the effects described in the second through the fourth embodiments.

(7) The microcomputer 13 compares the reference voltage Vr input to the input terminal Vrin, with the power supply voltage VCC input to the input terminal VCCin, and detects an abnormality in the power supply voltage VCC based on those comparison results. Configured in this way, an abnormality in the power supply voltage VCC can be detected without installing an input terminal Vcin in the microcomputer 13 for inputting the sub-divided voltage Vc.

In each of the above described embodiments, an ECU 1 that is used while mounted in an automotive vehicle is described as an example however the present invention is not limited by this example. Any electronic control device is applicable to the present invention as long as the power supply voltage is provided to the processor circuits such as microcomputers and an abnormality in this power supply voltage is detected.

In the above described embodiments, the examples utilizing the microcomputer 13 as the processor circuit are described, however the present invention is not limited to the microcomputer 13 as a processor circuit and other processor circuits such as a digital signal processor (DSP) or programmable logic device (PLD) may also be utilized.

The above described embodiments and modifications are merely examples and as long as the features of the present invention remain intact, the present invention is not limited by the contents.

LIST OF REFERENCE SIGNS

1 ECU
11 Power supply IC
12 Reference voltage generator circuit
13 Microcomputer
14 A-D converter
15 External load drive circuit
16, 17 Voltage-divider resistor
18 Voltage isolation element
19 Capacitor
20 Resistor
21, 22 MOSFET
23 Capacitor
24, 25 Diode

The invention claimed is:

1. An electronic control unit comprising:
a processor circuit that includes a first input terminal and a second input terminal;
a power supply circuit that supplies a power supply voltage to the first input terminal;
a voltage-dividing circuit that outputs a sub-divided voltage that is sub-divided from the power supply voltage;
a capacitor coupled at one end to the second input terminal and on the other end to ground; and
a voltage isolation element that functions along with the capacitor to output a reference voltage isolated from the power supply voltage and the sub-divided voltage to the second input terminal,
wherein the processor circuit detects an abnormality in the power supply voltage by utilizing the reference voltage input to the second input terminal.

2. The electronic control unit according to claim 1,
wherein the processor circuit further includes a third input terminal to input the sub-divided voltage from the voltage-dividing circuit, and
compares the reference voltage input to the second input terminal, with the sub-divided voltage input to the third input terminal, and detects an abnormality in the power supply voltage based on the comparison results.

3. The electronic control unit according to claim 1,
wherein the processor circuit compares the reference voltage input to the second input terminal, with the power supply voltage input to the first input terminal, and detects an abnormality in the power supply voltage based on the comparison results.

4. The electronic control unit according to claim 1,
wherein the voltage isolation element contains a resistor, the resistor and the capacitor configure an integrating circuit, and the output from the integrating circuit is output as the reference voltage to the second input terminal.

5. The electronic control unit according to claim 4,
wherein a time constant for the integrating circuit is set according to at least either one of the time from the power supply circuit starting to supply a power supply voltage to the start of operation of the processor circuit and the time from an abnormality occurring in the power supply voltage to the detection of that abnormality by the processor circuit.

6. The electronic control unit according to claim 4,
wherein the voltage isolation element further contains a switching circuit that switches the coupling state between the voltage-dividing circuit and the second input terminal.

7. The electronic control unit according to claim 6,
wherein the switching circuit includes:
a first switching device coupled to the voltage-dividing circuit side;
a second switching device coupled to the second input terminal side;
a switching circuit capacitor coupled at one end between the first switching device and the second switching device, and coupled at the other end to ground;
a first diode coupled between both switch ends of the first switching device, in a sequential direction from the switching circuit capacitor towards the voltage-dividing circuit; and
a second diode coupled between both switch ends of the second switching device, in a sequential direction from the switching circuit capacitor towards the second input terminal, and
wherein when an abnormality occurs in the power supply voltage, the coupling between the voltage-dividing circuit and the second input terminal is cut by setting the first switching device and the second switching device to an open state.

8. The electronic control unit according to claim 7,
wherein the power supply circuit periodically outputs a signal for switching the first switching device and the second switching device from an open state to a conducting state, to the first switching device and the second switching device, and cuts the coupling between the voltage-dividing circuit and the second input terminal by stopping the signal.

9. The electronic control unit according to claim 6,
wherein the switching circuit includes:
a switching device; and
a diode coupled between both switch ends of the switching device, in a sequential direction from the voltage-dividing circuit towards the second input terminal or from the second input terminal towards the voltage-dividing circuit, and
wherein when an abnormality occurs in the power supply voltage, the coupling between the voltage-dividing circuit and the second input terminal is cut by setting the switching device to the open state.

10. The electronic control unit according to claim 9,
wherein along with periodically outputting a signal to the switching device for switching the switching device from an open state to a conducting state, the power supply circuit also cuts the coupling between the voltage-dividing circuit and the second input terminal by stopping the signal.

11. The electronic control unit according to claim 1,
wherein the voltage isolation element includes a switching circuit to switch the coupling state between the voltage-dividing circuit and the second input terminal.

12. The electronic control unit according to claim 11,
wherein the switching circuit includes:
a first switching device coupled to the voltage-dividing circuit side;

a second switching device coupled to the second input terminal side;
a switching circuit capacitor coupled at one end between the first switching device and the second switching device, and coupled at the other end to ground;
a first diode coupled between both switch ends of the first switching device, in a sequential direction from the switching circuit capacitor towards the voltage-dividing circuit; and
a second diode coupled between both switch ends of the second switching device, in a sequential direction from the switching circuit capacitor towards the second input terminal, and
wherein when an abnormality occurs in the power supply voltage, the coupling between the voltage-dividing circuit and the second input terminal is cut by setting the first switching device and the second switching device to an open state.

13. The electronic control unit according to claim 12, wherein along with periodically outputting a signal to the first switching device and the second switching device for switching the first switching device and the second switching device from an open state to a conducting state, the power supply circuit also cuts the coupling between the voltage-dividing circuit and the second input terminal by stopping the signal.

14. The electronic control unit according to claim 11, wherein the switching circuit includes:
a switching device; and
a diode coupled between both switch ends of the switching device, in a sequential direction from the voltage-dividing circuit towards the second input terminal or from the second input terminal towards the voltage-dividing circuit, and
wherein when an abnormality occurs in the power supply voltage, the coupling between the voltage-dividing circuit and the second input terminal is cut by setting the switching device to the open state.

15. The electronic control unit according to claim 14, wherein along with periodically outputting a signal to the switching device for switching the switching device from an open state to a conducting state, the power supply circuit also cuts the coupling between the voltage-dividing circuit and the second input terminal by stopping the signal.

* * * * *